INVENTOR
Xavier Kollmeier

BY Sughrue & Rothwell
ATTORNEYS

INVENTOR

Xavier Kollmeier

BY Sughrue & Rothwell

ATTORNEYS

June 5, 1962

X. KOLLMEIER 3,037,265

METHOD FOR MAKING PRINTED CIRCUITS

Filed Dec. 30, 1957

4 Sheets-Sheet 3

INVENTOR
Xavier Kollmeier

BY Sughrue & Rothwell
ATTORNEYS

June 5, 1962 X. KOLLMEIER 3,037,265

METHOD FOR MAKING PRINTED CIRCUITS

Filed Dec. 30, 1957 4 Sheets-Sheet 4

INVENTOR
Xavier Kollmeier

BY Sughrue & Rothwell
ATTORNEYS

United States Patent Office 3,037,265

Patented June 5, 1962

3,037,265

METHOD FOR MAKING PRINTED CIRCUITS

Xavier Kollmeier, Buchanan, N.Y., assignor to International Business Machines Corporation, New York, N.Y., a corporation of New York Filed Dec. 30, 1957, Ser. No. 705,890

3 Claims. (Cl. 29—155.5)

This invention relates to a method and apparatus for making a printed circuit and more particularly to forming a through connection between conductors on opposite sides of a printed circuit board.

The term "printed circuit" used herein is not to be limited to the type of circuit in which the electrical leads or conductors are literally printed on a circuit board, for example, as with conductive ink. On the contrary, the term "printed circuit" is used in the broader meaning which it has attained in the art of making preformed circuit boards wherein the conductors or leads may be printed, pressed, etched, embossed, or otherwise formed on an insulating circuit board. Printed circuits are widely used in electrical apparatus as they may be mass produced, may carry complex circuits thereon, and they provide reliable electrical connections.

In the art of making printed circuits, there has arisen the problem of making mechanically strong and electrically sound connections between conductors or leads on opposite sides of the printed circuit board. One solution known in the prior art is to drill or punch a hole in the insulating board and place a conductive bushing in the hole to electrically connect the two conductors. Although this through connection appears to be effective, the method of making it is somewhat time-consuming and therefore expensive. Accordingly, the principal object of this invention is to provide an improved method and apparatus for making a mechanically strong and electrically sound through connection between conductors on opposite sides of a printed circuit board.

A further object of this invention is to make a printed circuit complete with a through-hole connection as described above by a process and apparatus whereby the making of the through-hole connection and the forming or "printing" of the circuit are accomplished together using the same apparatus without the need for any separate bushing or insert for making the connection between conductors printed on opposite sides of the circuit board.

In the attainment of the foregoing objects, this invention contemplates making an electrical connection between electrically conductive sheets on opposite sides of a deformable plastic insulating base by applying heat and pressure to press the conductive sheets into contact with each other in the area where said connection is to be made while deforming the insulating base in this area and causing the deformed base to project through one of the sheets. The sheets are then pierced in this area thereby removing the deformed excess portion of the base and providing a through-hole connection with the sheets in electrical contact around the edges of the hole.

These and other objects will become more apparent from the following specification in which a preferred embodiment of this invention is described with reference to the accompanying drawings in which:

FIGS. 1 to 3, inclusive, illustrate the basic steps involved in making the through connection according to the preferred embodiment of this invention;

Figure 1:
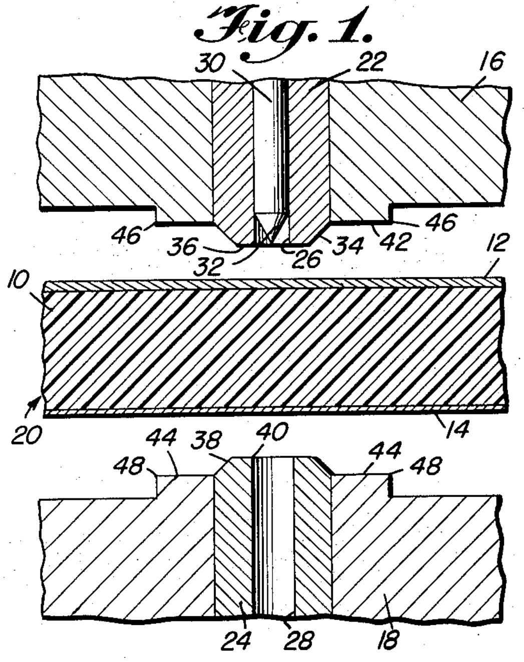

As shown in FIGS. 1 to 4, inclusive, a heat and pressure deformable plastic base 10, for example, a semi-cured phenolic resin, is sandwiched between an upper conductive sheet of foil 12 and a lower conductive sheet of foil 14 and the sandwich panel 20 thus formed is positioned between an upper mold insert 16 and a lower mold insert 18. The upper foil sheet 12 is preferably thicker than the lower foil sheet 14. The panel 20 including the base 10 with its upper and lower sheets 12 and 14 is positioned so that the area in which a through connection is to be made is between an upper mold bushing 22 carried by upper mold insert 16 and a lower mold bushing 24 carried by lower mold insert 18. Bushings 22 and 24 are in opposed aligned relationship and are provided with central longitudinal bores 26 and 28 which are also in opposed aligned relationship. Slidably positioned within bore 26 is a piercing pin 30 having a conical point 32. Die bushing 22 has a projection 34 which extends below the lower face of mold insert 16. The lower face 36 of projection 34 is adapted to press against sheet 12 when mold inserts 16 and 18 are pressed together. Lower mold bushing 14 also has a projection 38 which extends above the upper surface of mold insert 18. Mold inserts 16 and 18 each have other outer projections 42 and 44, respectively, which form corresponding cutting edges 46 and 48.

Figure 2:
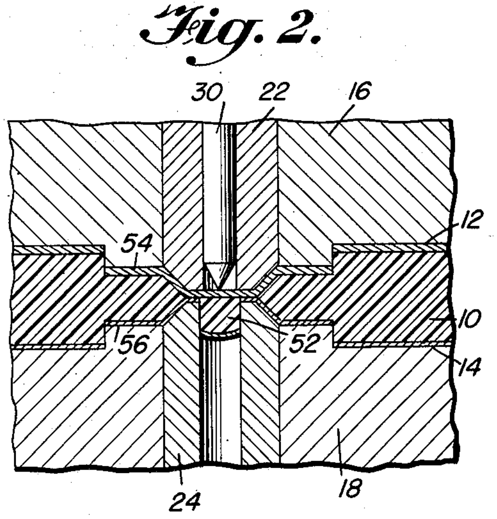

In making the through connection according to the process embodying this invention, the molding apparatus carrying mold inserts 16 and 18 is placed in a heated press so that they may be pressed together, thereby applying heat and pressure to panel 20 in the area where the through connections are to be formed. As shown in FIG. 2, when the mold inserts 16 and 18 are brought together, the upper and lower conductive sheets 12 and 14 are forced into face-to-face contact with each other. The excess plastic insulating base 10 is deformed by the heat and pressure and forced through thinner lower sheet 14, thereby projecting into bore 28 to form an excess plastic protuberance 52 as shown in FIG. 2. As the mold inserts 16 and 18 are brought together, edges 46 and 48 on projections 42 and 44, respectively, simultaneously sever upper and lower portions 54 and 56 from sheets 12 and 14, respectively. Since the plastic insulating base 10 is initially in a semi-cured state, the heat and pressure exerted during this step cure the plastic and cause the upper and lower conductive sheets 12 and 14 to be molded and to adhere tenaciously to plastic insulating base 10.

Figure 3:
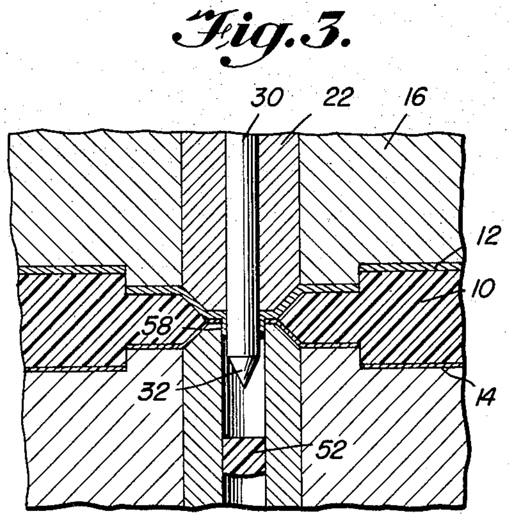

As shown in FIG. 3, the next step involves forcing piercing pin 30 downwardly within bore 26 until it pierces conductive sheet 12 to form a hole 60 therein. As piercing pin 30 continues downwardly into bore 28, it bends the surrounding sheet 12 downwardly into a somewhat circular flange 58. As flange 58 is bent downwardly, it is pressed tightly against portion 56 of lower conductive sheet 14 around the edges of opening 50. In addition, the downward movement of pin 30 causes conical point 32 to engage the excess plastic protuberance 52 and separate the protuberance from the board. Due to the forces of gravity and the downwardly moving pin 30, protuberance droplet 52 is forced downwardly through bore 28 from where it may be removed.

Figure 4:
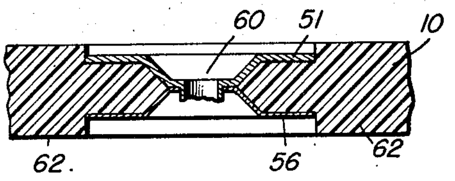
FIG. 4 is a cross-sectional view of a through-hole connection in a printed circuit panel made according to the process illustrated in the previous figures.

FIG. 4 shows a cross-sectional view of the completed through connection made by the foregoing process. All but portions 54 and 56 of upper and lower conductive sheets 12 and 14, respectively, may be removed by grinding or other suitable means, thereby leaving a completed through connection in the printed circuit panel suitable for receiving the lead of an electrical component which it is desired to connect into the circuit of which this through-hole connection is a part. The entire printed circuit board with the lead inserted in hole 60 may then be dip-soldered to form a strong electrical and mechanical connection between the lead and the through-hole connection.

According to the preferred embodiment of this invention, upper and lower conductive sheets 12 and 14 are of adhesive backed or sintered backed copper foil, with upper sheet 12 being approximately twice the thickness of lower sheet 14. This ratio of thickness assures that the deformed plastic will be forced through the thinner lower sheet rather than the thicker upper sheet when the dies are brought together. Other means could be provided for allowing excess plastic protuberance 52 to project through the lower sheet 12, for example, the sheets 12 and 14 could be the same thickness and the lower projection 38 could cut or weaken sheet 14 around the edge of the hole 50, or the bore 26 could be plugged solid to provide a backing for the top foil sheet during the molding operation.

Figure 5:
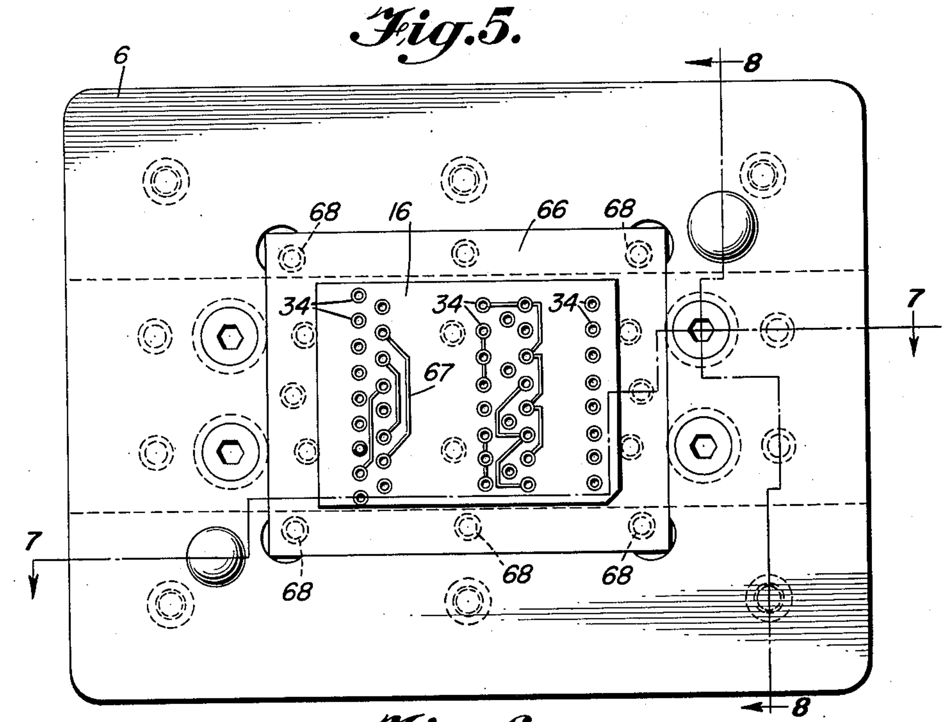
FIG. 5 is a plan view of the lower face of the upper mold of a molding apparatus which may be used in making the printed circuit.
Figure 6:
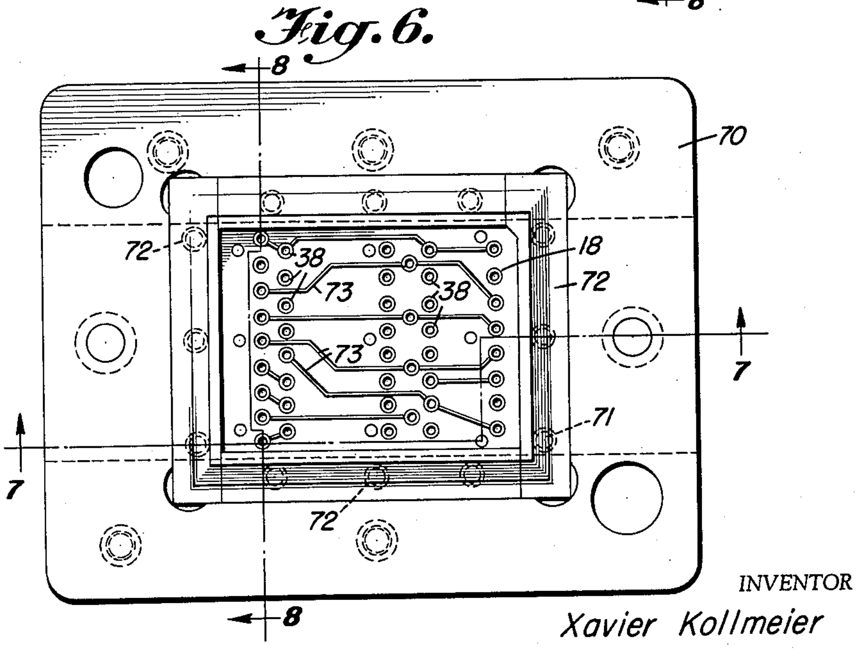
FIG. 6 is a plan view of the upper face of the lower mold.
Figures 10, 11:
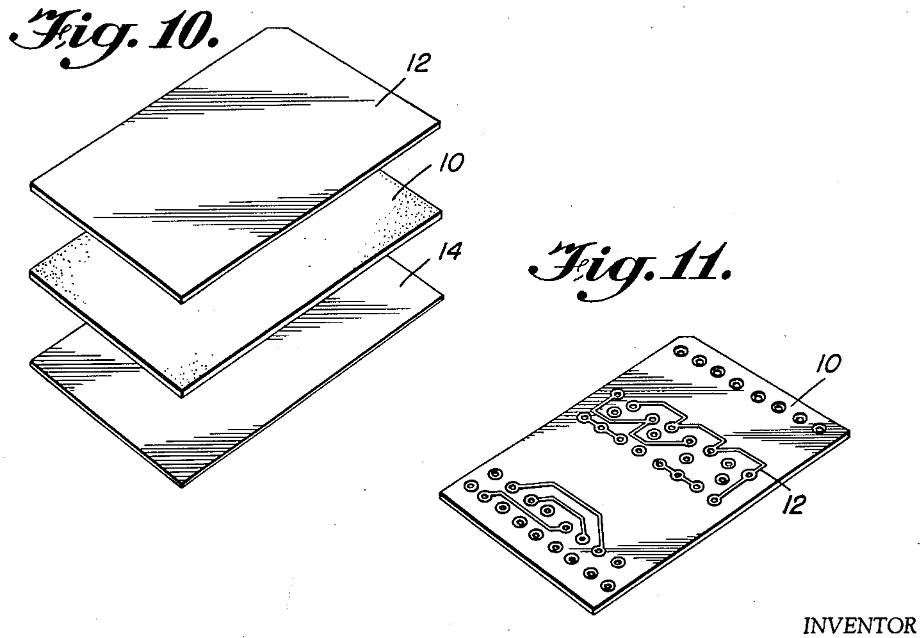
FIG. 10 is an exploded view showing the upper and lower conductive sheets and the insulating base from which a preferred embodiment of the printed circuit panel is made.
FIG. 11 is a perspective view of one surface of a completed printed circuit panel with through connections therein made by the process and apparatus of this invention.

FIGS. 5 and 6 show the mating faces of the molding apparatus embodying this invention. In FIG. 5 there is shown the lower face of the upper mold including upper chase 64 carrying upper mold insert 16. Mold insert 16 is rigidly mounted in a frame 66 which is securely fixed to chase 64 by bolts 68. Mold insert 16 carries a plurality of the bushing dies 22 having projections 34, which are adapted to form through-hole connections in cooperation with the corresponding lower bushing dies as previously described. Circuit delineating ribs 67 in upper mold insert 16 project downwardly the same distance as projections 42 and are for the purpose of forming the electrical leads from upper conductive sheet 12 to electrically connect selected through-hole connections on one side of the completed printed circuit panel as shown in FIG. 11.

In FIG. 6 there is shown the upper face of the lower mold which includes a lower chase 70 carrying lower mold insert 18. Insert 18 is rigidly mounted in frame 72 which is securely fixed to chase 70 by bolts 71. The lower mold insert 18 also contains projecting circuit delineating ribs 73 similar in nature to ribs 67 in the upper mold insert 16, which are for the purpose of forming electrical leads for connecting selected through-hole connections on this side of the finished printed circuit panel.

Figure 7:
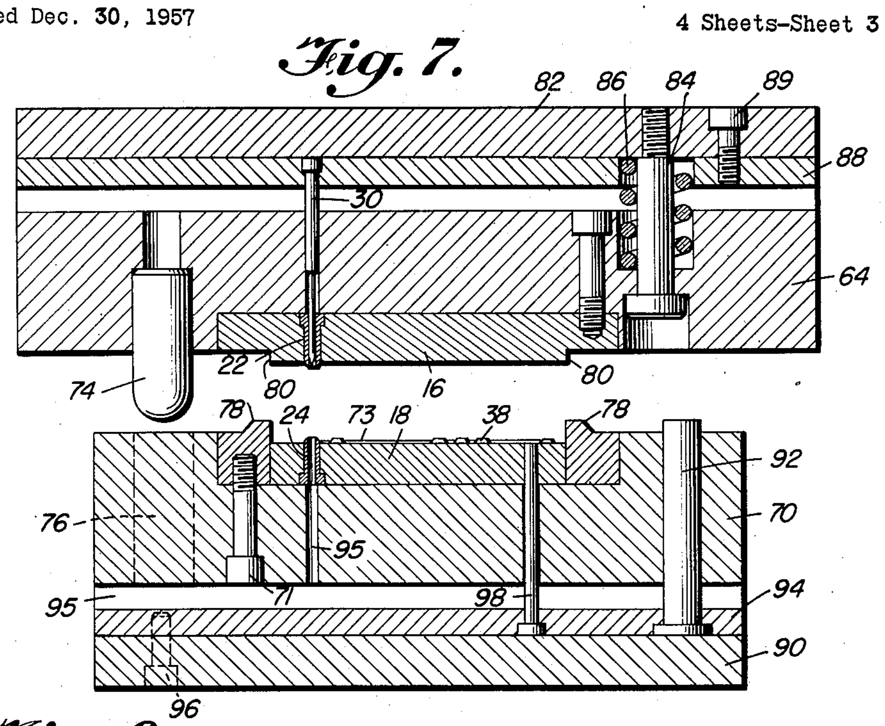
FIG. 7 is a front sectional elevation view taken along line 7—7 in FIGS. 5 and 6.
Figure 8:
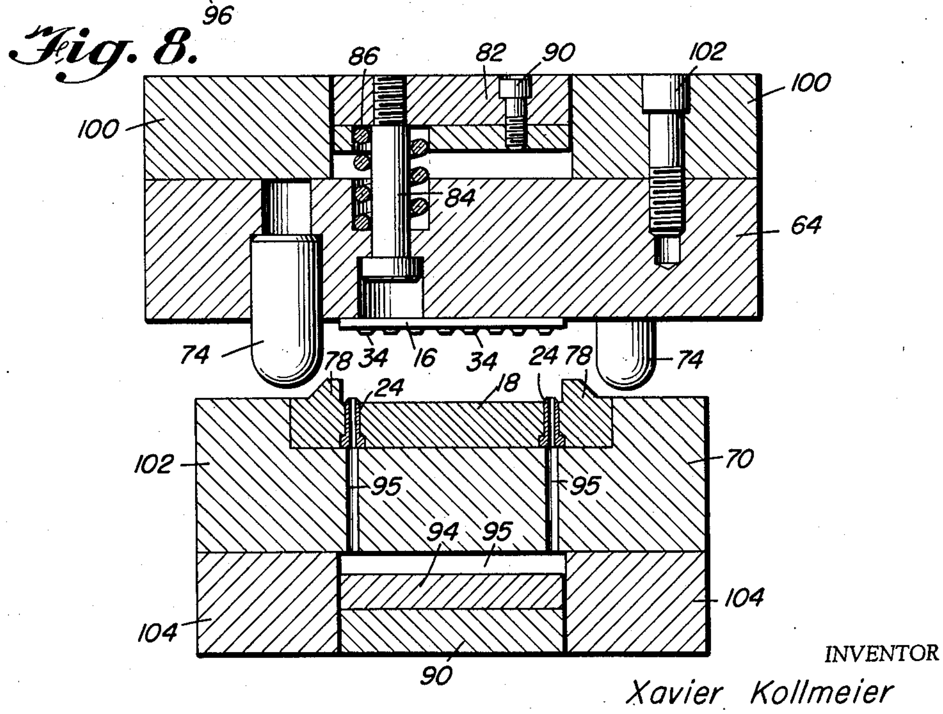
FIG. 8 is a side sectional elevation view taken along line 8—8 in FIGS. 5 and 6.

The sectional views shown in FIGS. 7 and 8 more clearly illustrate the structure of the upper and lower molds embodying this invention. Mounted in upper chase 64 are dowels 74 which are received in bores 76 to assure proper alignment of upper and lower mold inserts 16 and 18 when the upper and lower chases are brought together. In addition, frame 72 is provided with projections 78 which mate with the recesses 80 in frame 66 to insure further proper alignment of the upper and lower inserts during the molding process and to limit the downward movement of the upper die insert.

A piercing rod actuating bar 82 is resiliently mounted on chase 64 by a plurality of spring assemblies each including a bolt 84 and a heavy spring 86 as shown in FIG. 7. A piercing pin retainer bar 88 is fixed to the lower surface of bar 82 by screw means 89 and retains the heads of the piercing pins 30 therebetween. An ejector actuating bar 90 is slidably mounted on lower chase 70 by return pins 92. A pin retaining plate 94 is secured to the upper face of bar 90 by fastening means bolt 96 and this plate rigidly mounts the head of each return pin 92 with respect to bar 90. An ejector pin 98, whose head is also retained by plate 94, is mounted to slide within chase 70. A channel 95 is present in the lower chase 70 through which the ejected protuberances 52 may be removed.

A pair of parallel bars 100 are secured by bolts 102 to the upper surface of chase 64, and parallel bars 104 are similarly fixed to the lower surface of chase 70. These parallel bars are the means through which the heat and pressure are applied to the mold inserts 16 and 18 and thence to the printed circuit board being molded.

Figure 9:
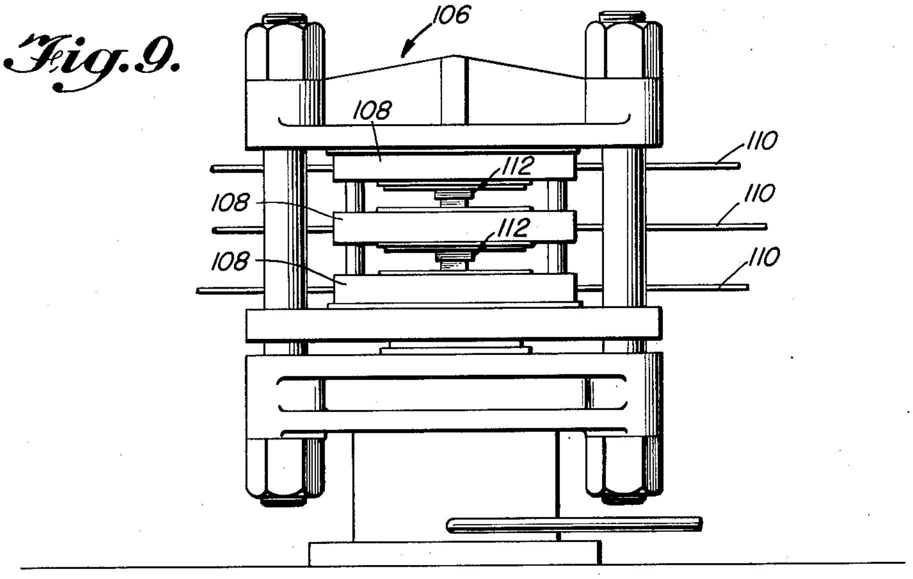
FIG. 9 is an elevational view of the printed circuit and through-hole connection molds assembled and placed in a conventional press for the application of heat and pressure to the molds.

The assembled sandwich panel and molding dies may be placed in a conventional heated platen press 106, FIG. 9, having pressure-exerting platens 108 to which are connected conduits 110 for carrying steam through the platens, thus providing the heat and pressure used in this process for curing and deforming the plastic insulating base 10, while forming the through connections.

In operation, an assembled mold 112 is placed in press 106 so that platens 108 exert pressure in opposite directions on parallel bars 100 and 104. This pressure is transmitted to upper chase 64 and lower chase 70 to force upper and lower mold inserts 16 and 18 together. Dowels 74 have been received in their corresponding bores 76 to assure proper alignment of the upper and lower chases and shoulders 78 on lower die insert 18 engage corresponding recesses 80 in upper die insert 16 to limit the downward movement of die insert 16 and thereby limiting the final thickness of the insulating base 10 carrying the conductive sheets 12 and 14. Heat passing through conduits 110 is likewise transmitted to the die inserts and through the upper and lower conductive sheets to plastic insulating base 10. This heat, coupled with the pressure, forces the selected portions of the conductive sheets 12 and 14 into the insulating base 10 which is simultaneously cured by the heat. These selected portions correspond to the circuit delineating ribs 67 and 73 and die bushing projections 34 and 38 of the upper and lower mold inserts 16 and 18 as shown in FIGS. 5 and 6. Simultaneously, edges 46 and 48 sever portions from upper and lower conductive sheets 12 and 14, respectively, to form an area of conductive foil or sheet surrounding each through connection in the panel.

After the circuit panel has been "formed" as described, the pressure may be removed and piercing rod actuating bar 82 forced downwardly by any known means against the pressure of spring 86, thereby forcing piercing pin 30 downwardly. Point 32 of piercing pin 30 punches through upper conductive sheet 12 to form a flange 58 which engages lower sheet 14 around the periphery of opening 60 and to break away the excess plastic protuberance 52 of the insulating base and force it down through bore 28 into channel 95 from where it may be removed.

After the printed circuit panel has been completely molded and upper and lower mold inserts 16 and 18 have been separated, the panel 20 may adhere to the lower mold insert 18. If this occurs, pressure may be applied upwardly against bar 90 to force ejector pin 98 upwardly against the lower surface of the printed circuit panel, thereby disengaging it from lower mold insert 18. Return pins 92 are provided for the purpose of returning ejector pin 98 to its lower position within lower mold insert 18 prior to another molding operation. When upper chase 64 is brought downwardly, it will first engage return pin 92 which is still in its upper position, and force it downwardly together with bar 90 and ejector pin 98.

FIG. 10 shows insulating base 10 and the thicker and thinner conductive sheets 12 and 14, respectively, prior to being molded into a printed circuit board. FIG. 11 shows the completed printed circuit board and through connections made according to the principles of this invention.

A preferred embodiment of this apparatus and process for making a printed circuit board and through-hole connections therein has been described above for the illustrative purpose of enabling one skilled in the art to practice the invention. The disclosed embodiment is not to be considered limiting on the scope of this invention which is defined in the appended claims.

What is claimed is:

1. A process of making a printed circuit board comprising: placing an electrically conductive sheet on each side of a semi-cured plastic insulating material board, one sheet being thicker than the other; applying heat and pressure to press selected portions of each conductive sheet into said plastic insulating material and simultaneously cure said plastic material, said heat and pressure forcing at least two opposed portions of said conductive sheets into contact with each other in at least one selected area of said circuit board and deforming said plastic insulating base in said area; forcing the excess material deformed when said conductive sheets are pressed together through the thinner conductive sheet thereby forming a protuberance; piercing said thicker conductive sheet in said selected area to form a hole in said sheet; swaging said thicker sheet into further contact with said thinner sheet and punching out said protuberance, thereby forming a through connection between opposed selected portions of said conductive sheets in said area of said printed circuit board.

2. A process for forming a through-hole connection in a solid printed circuit board comprising; applying an electrically conductive sheet to each side of a solid board of plastic insulating material, one of said conductive sheets being thinner than the other, heating and pressing said board in an area where said connection is to be formed and forcing the conductive sheets into contact with each other over at least a portion of said area while simultaneously deforming the insulating material in said area, forcing the excess insulating material to project through the thinner of said conductive sheets, piercing said printed circuit board in said area to form a hole in the thicker sheet, swaging said thicker sheet into contact with the edge of the hole formed by forcing the base material from said board, and removing said projection of excess insulating material, thereby forming a through-hole connection in said circuit board.

3. A method of forming a through connection between conductors on opposite sides of a printed circuit panel which includes a solid plastic insulating base with electrically conductive sheets on each side thereof wherein one of said conductive sheets is rendered weaker than the other, said method comprising; applying heat and pressure to the panel and pressing the conductive sheets into contact with each other in the area where said connection is to be formed while simultaneously deforming said insulating base in said area, displacing the deformed base material through the weaker of said conductive sheets, piercing said conductive sheet which does not have the deformed base forced therethrough in said area to form a hole therein, swaging said pierced sheet into contact with the edges of the opening formed by forcing the deformed base material from said panel, and punching out said deformed base material.

References Cited in the file of this patent

UNITED STATES PATENTS

| | | |
|---|---|---|
| 2,320,498 | Wheeler | June 1, 1943 |
| 2,545,229 | Crawford | Mar. 13, 1951 |
| 2,593,730 | Cornell | Apr. 22, 1952 |
| 2,633,441 | Buttress | Mar. 31, 1953 |
| 2,716,268 | Steigerwalt | Aug. 30, 1955 |
| 2,753,619 | Franklin | July 10, 1956 |
| 2,889,393 | Berger | June 2, 1959 |
| 2,912,747 | Oshry et al. | Nov. 17, 1959 |
| 2,912,748 | Gray | Nov. 17, 1959 |
| 2,925,645 | Bell | Feb. 23, 1960 |

FOREIGN PATENTS

| | | |
|---|---|---|
| 510,001 | Germany | Oct. 15, 1930 |